(12) United States Patent
Kajiyama et al.

(10) Patent No.: US 7,701,133 B2
(45) Date of Patent: Apr. 20, 2010

(54) ORGANIC ELECTROLUMINESCENT DISPLAY DEVICE AND METHOD OF REPAIRING A DEFECTIVE PIXEL OF THE DEVICE

(75) Inventors: Kenta Kajiyama, Mobara (JP); Toshihiro Sato, Mobara (JP); Naoki Tokuda, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 1063 days.

(21) Appl. No.: 11/384,415

(22) Filed: Mar. 21, 2006

(65) Prior Publication Data

US 2006/0214575 A1    Sep. 28, 2006

(30) Foreign Application Priority Data

Mar. 22, 2005  (JP) .............................. 2005-081625

(51) Int. Cl.
   *H05B 33/00*   (2006.01)
   *G09G 3/10*    (2006.01)
   *H01J 9/00*    (2006.01)
(52) U.S. Cl. .................... 313/504; 313/506; 445/24; 445/5; 445/61; 315/169.3
(58) Field of Classification Search ............. 315/169.3; 445/24, 61
   See application file for complete search history.

(56) References Cited

U.S. PATENT DOCUMENTS

| | | | |
|---|---|---|---|
| 6,284,342 B1 * | 9/2001 | Ebisawa et al. ............... 428/69 |
| 6,344,661 B1 * | 2/2002 | Nagase et al. ................. 257/40 |
| 6,605,372 B1 * | 8/2003 | Kubota ........................ 428/690 |
| 6,747,728 B2 | 6/2004 | Nagayama | |
| 7,258,586 B2 * | 8/2007 | Tamura et al. ................. 445/24 |
| 2003/0222861 A1 * | 12/2003 | Nishikawa et al. .......... 345/204 |
| 2005/0269962 A1 * | 12/2005 | Matsunaga ............... 315/169.3 |

FOREIGN PATENT DOCUMENTS

| | | |
|---|---|---|
| JP | 2000-331782 | 5/1999 |
| JP | 2001-118684 | 10/1999 |
| JP | 2003-178871 | 12/2001 |

* cited by examiner

*Primary Examiner*—Sikha Roy
(74) *Attorney, Agent, or Firm*—Stites & Harbison PLLC; Juan Carlos A. Marquez, Esq.

(57) ABSTRACT

The present invention provides an organic electroluminescent display device and a method of repairing a defective pixel of an organic electroluminescent display device which can realize the repairing a defective pixel to a light emitting pixel by electrically separating a leak portion which generates a defective pixel. To be more specific, a peeling suppression layer is formed between an anode and an organic light emitting layer formed on a main substrate, and a cavity is formed between the main substrate and the peeling suppression layer due to the evaporation generated by an absorption of laser beams thus electrically separating a defective portion so as to repair a black-dot defective pixel to form a light emitting pixel.

5 Claims, 4 Drawing Sheets

ORGANIC ELECTROLUMINESCENT DISPLAY DEVICE AND METHOD OF REPAIRING A DEFECTIVE PIXEL OF THE DEVICE

CROSS-REFERENCE TO THE RELATED APPLICATION

The disclosure of Japanese Patent Application No. P2005-081625 filed on 2005/03/22 (yyyy/mm/dd) including the claims, the specification, the drawings and the abstract is incorporated herein by reference in its entirety.

BACKGROUND OF THE INVENTION

1. Field of the Invention

The present invention relates to an organic electroluminescent display device which forms an organic light emitting layer between a pair of electrodes and emits light by applying an electric field to the organic light emitting layer by the pair of electrodes, and more particularly to an organic electroluminescent display device which can repair a black-dot defective pixel or a bright-failure defective pixel formed in the inside of a display region to form an light emitting pixel and a method for repairing such a defective pixel.

2. Description of Related Art

Recently, as a flat panel type display device, a liquid crystal display device (LCD), a plasma display device (PDP), a field emission type display device (FED), an organic electroluminescent display device (OLED) or the like has been commercialized and has been studied for commercialization. Among these display devices, the organic electroluminescent display device is an extremely prospective display device as a display device for future generation as a typical example of a thin and light-weighted emissive display device. The organic electroluminescent display device is classified into a so-called bottom-emission-type display device and a top-emission-type display device.

The bottom-emission-type organic electroluminescent display device constitutes an organic light emitting element by a light emitting mechanism which is constructed by sequentially stacking a transparent conductive thin film made of ITO (In—Ti—O) or IZO (In—Zn—O) which constitutes a first electrode or one electrode, an organic multi-layered film which emits light when an electric field is applied thereto (also referred to as organic light emitting layer), and a reflective metal electrode which constitutes a second electrode or another electrode on an insulating substrate which is preferably formed of a glass substrate. A large number of these organic light emitting elements are arranged in a matrix array, another substrate which is also referred to as a sealing can is provided in a state that another substrate covers the stacked structure, and the above-mentioned light emitting structure is insulated from an external atmosphere.

Further, by applying an electric field between both electrodes in a state that the transparent electrode is used as an anode and the metal electrode is used as a cathode, for example, careers (electrons and holes) are injected into the organic multi-layered film and this organic multi-layered film emits light. The emitted light is radiated to the outside from a glass substrate side.

On the other hand, in the top emission-type organic electroluminescent display device, in a state that the above-mentioned one electrode is formed of a metal electrode having the reflectance and another electrode is formed of a transparent electrode such as an ITO film, by applying an electric field between both electrodes, the organic multi-layered film emits light and the emitted light is radiated from the above-mentioned another electrode side. In the top emission type display device, a transparent plate which is preferably formed of a glass plate is used as a sealing can in the bottom-emission-type display device.

The organic light emitting phenomenon is a phenomenon which is generated by sandwiching an organic light emitting layer between a lower electrode and an upper electrode and by allowing the organic light emitting layer to emit light with an electric current supplied from upper and lower electrodes. The organic electroluminescent display device which makes use of such a light emitting phenomenon displays a two-dimensional image by arranging a large number of pixels in a matrix array, wherein the organic electroluminescent display device is classified into a passive-matrix-type display device and an active-matrix-type display device depending on a driving method. The passive-matrix-type organic electroluminescent display device is a display device which forms pixels by interposing organic light emitting layers at respective intersecting portion of a large number of scanning lines which extend in one direction and are arranged substantially in parallel to each other on a main surface of an insulating substrate and a large number of signal lines which extend in another direction which crosses one direction and are arranged substantially in parallel to each other on the main surface of the insulating substrate.

On the other hand, the active-matrix-type organic electroluminescent display device includes a large number of scanning lines which extend in one direction and are arranged in parallel to each other on a main surface of an insulating substrate, a large number of signal lines which extend in another direction which crosses one direction and are arranged in parallel to each other, and power source lines. The active-matrix-type organic electroluminescent display device further includes active elements such as thin film transistors (switching elements, hereinafter referred to as thin film transistors) at respective intersecting portions of the scanning lines and the signal lines. Further, an organic light emitting layer (hereinafter also referred to as OLED) is interposed between a lower electrode (pixel electrode) which is driven by the thin film transistor and an upper electrode which is connected to the power source line which supplies an electric current in response to a display signal supplied from the signal line. The active-matrix-type organic electroluminescent display device can eliminate a crosstalk between the pixels thus enabling a multi-gray-scale display with high definition.

FIG. 8 is a cross-sectional view for schematically explaining a constitutional example of the vicinity of one pixel of the organic electroluminescent display device. The organic electroluminescent display device shown in FIG. 8 is the active-matrix-type display device and is constituted such that a thin film transistor TFT is formed on a main surface (inner surface) of a transparent main substrate SUB1 which is preferably made of glass, and an organic light emitting layer OLE is sandwiched between one electrode (anode here) AD which is driven by the thin film transistor TFT and another electrode (here cathode) CD thus constituting a light emitting portion. Here, the thin film transistor TFT is constituted by a poly-silicon semiconductor layer PSI, a gate insulation layer IS1, a gate line (gate electrode) GL, a source-drain electrode SD, an interlayer insulation layer IS2, and an interlayer insulation layer IS3.

The anode AD which constitutes the pixel electrode is formed of a transparent conductive layer ITO which is formed over a passivation layer PSV, and the anode AD is electrically connected with a source-drain electrode SD via a contact hole which is formed between the passivation layer PSV and an interlayer insulation layer IS3. Further, the organic light emitting layer OLE is formed in a recessed portion surrounded by a bank BNK which is formed of an insulation layer applied to the anode AD by applying means such as a vapor deposition method or an ink jet method. Further, using a conductive matted film made of an aluminum thin film, a chromium thin film or the like, a cathode CD is formed in a state that the cathode CD covers the organic light emitting layer OLE and the bank BNK.

This organic electroluminescent display device is referred to as a so-called bottom-emission-type display device, wherein an emitted light L from the light emitting layer is radiated to the outside from a surface of the main substrate SUB1 as indicated by an arrow. Accordingly, the cathode CD is formed of a material which possesses a light reflecting function. To a main surface side of the main substrate SUB1, a sealing glass substrate SUB2 which is also referred to as a sealing can is adhered, and in the inside of a seal which surrounds a peripheral portion not shown in the drawing, nitrogen is filled and sealed.

In the organic electroluminescent display device having such a constitution, as shown in FIG. 9 which is a plan view of an essential part in which a display region is viewed from a first electrode (transparent electrode; anode) side, in a process for forming a large number of pixels PX (organic light emitting elements EL) on the main substrate SUB1, a leak portion LK exists within a pixel opening portion PAP due to a certain reason, and an electric current which contributes to the emission of light flows in the leak portion LK and hence, the organic light emitting element is short-circuited thus giving rise to a case in which a black-dot defective pixel BPX which generates a non-light-emitting region which does not emit light at the time of turning on the panel is generated.

Here, the black-dot defective pixel BPX means a pixel which does not emit light at all times compared to the light emitting element PX which always emits light and constitutes a light emitting region at the time of turning on the panel. Here, in the drawing, symbol PC indicates a pixel circuit, symbol PL indicates a power source line, and symbol GL indicates a gate line.

In the organic electroluminescent display device having such a constitution, as a method of repairing the black-dot defective pixel BPX which is generated within the display region, the laser repair method has been proposed. As a means which repairs the black-dot defective pixel BPX using this laser repair method, U.S. Pat. No. 6,590,335(patent document 1) discloses a means in which a portion of the metal electrode (cathode) corresponding to the defect is erased by the irradiation of laser beams, and an electric current is allowed to flow in a remaining portion of the defective pixel except for the defective portion thus repairing the defective pixel. Further, Japanese Patent Laid-open 2000-331782 (patent document 2) discloses a means in which a layer which is brought into contact with the transparent substrate among the organic material layer is formed into a leak preventing functional layer which is evaporated due to the absorption of the laser beams, and the metal electrode and the transparent electrode (anode) are separated from each other thus eliminating the occurrence of the leak. Further, U.S. Pat. No. 6,605,372 (patent document 3) discloses a manufacturing method and device in which the whole surfaces of an organic light emitting element in an dark-failure defective pixel or a brightness point defective pixel is irradiated with laser beams and hence, the pixel is insulated whereby the dark-failure defective pixel or the bright-failure defective pixel can be repaired.

SUMMARY OF THE INVENTION

However, in the organic electroluminescent display device having such a constitution, with respect to the structure described in the patent document 1 in which the defect corresponding portion of the metal electrode is erased by the irradiation of laser beams and the electric current is made to flow in the remaining portion of the defective pixel except for the defective portion thus repairing the defective pixel, the organic light emitting layer is also simultaneously peeled off due to the irradiation of laser beams and hence, when a hermetic sealing effect is lowered, moisture, oxygen or the like is easily absorbed thus giving rise to a drawback that a non-light-emitting region is enlarged.

Further, with respect to the structure which converts a layer which is brought into contact with the transparent substrate among the organic material layers into a leak preventing functional layer which evaporates due to the absorption of laser beams and in which the metal electrode and the transparent electrode are spaced apart from each other thus eliminating the generation of the leak, there exists a drawback that the organic light emitting layer is damaged by the absorption of the laser beams thus accelerating the deterioration of the light emitting region.

Accordingly, the present invention has been made to overcome the above-mentioned conventional drawbacks and it is an object of the present invention to provide a organic electroluminescent display device which can realize the repairing of a black-dot defective pixel to form a light emitting pixel by electrically separating a leak portion which generates the black-dot defective pixel and a method of repairing such a black-dot defective pixel.

The above-mentioned object can be achieved by a plurality of inventions described below.

According to an aspect of the present invention, there is provided an organic electroluminescent display device in which a peeling suppression layer is provided between a first electrode and an organic light emitting layer, and a cavity portion is formed by evaporating the peeling suppression layer due to an absorption of laser beams of near ultraviolet rays between the peeling suppression layer and a light transmitting substrate. In this invention, by forming the cavity portion, it is possible to electrically separate a portion which generates a defective pixel and hence, it is possible to obtain extremely excellent advantageous effects including an advantageous effect that a black-dot defective pixel or a bright-failure defective pixel which constitutes a defective pixel can be easily repaired to form the pixel which substantially uniformly emits light over the whole pixel.

Further, according to another aspect of the present invention, there is provided an organic electroluminescent display device in which a thermal expansion layer is provided between a first electrode and an organic light emitting layer, and a cavity portion is formed by thermal deformation due to heat generated by an absorption of laser beams of near ultraviolet rays between the thermal expansion layer and the first electrode. According to this invention, by providing the cavity portion, the portion which generates a defective pixel can be electrically separated and hence, it is possible to obtain extremely excellent advantageous effects including an advantageous effect that a black-dot defective pixel or a bright-failure defective pixel which constitutes a defective pixel can be easily repaired to form the pixel which substantially uniformly emits light over the whole pixel.

Further, according to another aspect of the present invention, there is provided a method of repairing a defective pixel of an organic electroluminescent display device in which a peeling suppression layer is formed between a first electrode and an organic light emitting layer, and the first electrode is irradiated with laser beams of near ultraviolet rays thus evaporating a portion of the first electrode which is irradiated with the laser beams of near ultraviolet rays.

Further, according to still another aspect of the present invention, there is provided a method of repairing a black-dot defective pixel of an organic electroluminescent display device in which a thermal expansion layer is formed between a first electrode and an organic light emitting layer, and the first electrode is irradiated with laser beams of near ultraviolet rays thus forming a portion of the first electrode which is irradiated with the laser beams of neat ultraviolet rays into a cavity.

Further, according to a method of repairing a defective pixel of an organic electroluminescent display device which uses the invention contained in other inventions of the present application, by selecting a wavelength band of the near ultraviolet rays which is absorbed in the first electrode, damages on the organic light emitting layer can be largely reduced and hence, it is possible to obtain extremely excellent advantageous effects including an advantageous effect that the repairing of the defective pixel can be easily performed.

Here, these repairing methods can obtain extremely excellent advantageous effects including an advantageous effect that either one of pixel effects of the black-dot failure defective pixel and the bright-failure defective pixel can be repaired simultaneously or individually.

Here, by adopting this repairing method as a portion of a manufacturing method in the following manner, it is possible to realize a high yield ratio. That is, first of all, after forming organic light emitting elements on a glass substrate, the organic light emitting elements are sealed with a recessed glass substrate thus forming a panel. Thereafter, a lighting inspection is applied to the panel thus determining the presence or non-presence of the defective pixel. The panel which has no defective pixel is transferred to a next step such as the mounting of a driver IC, the conduction aging or the like. With respect to the panel which has the defective pixel, it is confirmed whether the defect is a defect attributed to a foreign material or not. When the defective pixel is attributed to the foreign material, the above-mentioned repairing method is exercised and, thereafter, the panel is transferred to the next step such as the mounting of the driver IC, the aging or the like so as to manufacture the organic electroluminescent display device. In this manufacturing method, an inspection process and a repair process are performed after a sealing process. This is because that when the inspection process and the repair process are performed before sealing, the foreign material adheres to the panel in the midst of the inspection process or the repair process. The reason that the inspection process and the repair process are performed before the conduction aging is that although the organic light emitting layer of the pixel having no foreign material is substantially uniformly degraded over the whole pixel until the degradation reaches a range where the characteristics becomes stable due to the conduction aging, with respect to the organic layer of the pixel having the foreign material, the evaporation of the organic light emitting layer and an upper electrode is prevented due to the foreign material and hence, the short circuiting or the large leak is generated in the vicinity of the foreign material. Accordingly, a large current flows in the organic light emitting layer in the vicinity of the foreign material and hence, the organic light emitting layer is rapidly degraded, while the organic light emitting layer in a region which is remote from the foreign material in the inside of the same pixel is degraded more slowly compared to other portions. Accordingly, when the lighting inspection and the repairing are performed only in steps after the conduction aging, the pixel whose defect is repaired and the pixel which does not possess the defect from an original state emit lights with different luminances thus generating a region where the color balance becomes poor in a portion of a screen. That is, by performing the inspection process and the repairing process before the conduction aging, it is possible to improve the color balance of the organic electroluminescent display device.

Here, it is needless to say that the present invention is not limited to the above-mentioned respective constitutions and constitutions described in embodiments explained later and various modifications can be made without departing from the technical concept of the present invention.

BRIEF EXPLANATION THE OF DRAWINGS

FIG. 1A to FIG. 1C are views of an active-matrix-type organic electroluminescent display device which schematically shows the constitution of an embodiment 1 of the organic electroluminescent display device according to the present invention, wherein FIG. 1A is a plan view of an essential part in which a display region is viewed from a first electrode side, FIG. 1B is an enlarged cross-sectional view of a light emitting pixel in FIG. 1A and FIG. 1C is an enlarged cross-sectional view of a leak portion LK in FIG. 1A;

FIG. 2 is an enlarged cross-sectional view of a light emitting pixel of the active-matrix-type organic electroluminescent display device which schematically shows the constitution of the embodiment 1 of the organic electroluminescent display device according to the present invention;

FIG. 3A and FIG. 3B are enlarged cross-sectional views of a pixel of an active-matrix-type organic electroluminescent display device which schematically shows the constitution of an embodiment 2 of the organic electroluminescent display device according to the present invention wherein FIG. 3A is the enlarged cross-sectional view of the black-dot defective pixel and FIG. 3B is the enlarged cross-sectional view of a light emitting pixel after repairing the black-dot defective pixel;

FIG. 4A and FIG. 4B are enlarged cross-sectional views of a pixel of an active-matrix-type organic electroluminescent display device which schematically show the constitution of an embodiment 3 of the organic electroluminescent display device according to the present invention wherein FIG. 4A is the enlarged cross-sectional view of the black-dot defective pixel and FIG. 4B is the enlarged cross-sectional view of a light emitting pixel after repairing the black-dot defective pixel;

FIG. 5A and FIG. 5B are enlarged cross-sectional views of a pixel of an active-matrix-type organic electroluminescent display device which schematically shows the constitution of an embodiment 4 of the organic electroluminescent display device according to the present invention wherein FIG. 5A is the enlarged cross-sectional view of the black-dot defective pixel and FIG. 5B is the enlarged cross-sectional view of a light emitting pixel after repairing the black-dot defective pixel;

DETAILED DESCRIPTION OF THE INVENTION

Hereinafter, specific embodiments of the present invention are explained in conjunction with drawings which show these embodiments. Here, an active-matrix-type bottom emission type organic electroluminescent display device is explained as an example.

Embodiment 1

Figure 1A:
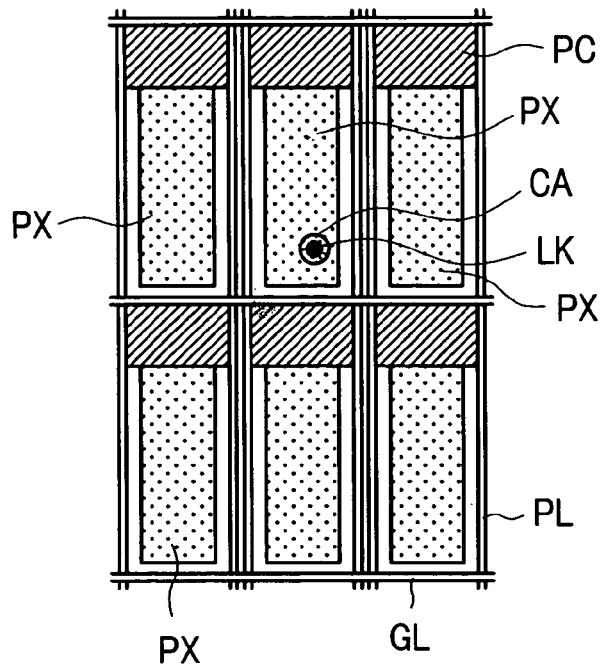
Figure 1B:
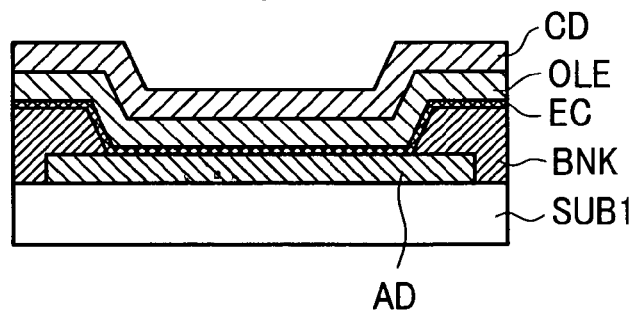
Figure 1C:
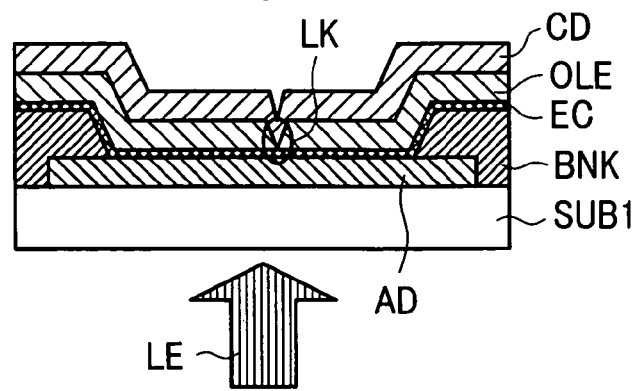

FIG. 1A to FIG. 1C are views of an active-matrix-type organic electroluminescent display device which schematically show the constitution of an embodiment 1 of the organic electroluminescent display device according to the present invention, wherein FIG. 1A is a plan view of an essential part in which a display region is viewed from a first electrode (transparent electrode: anode) side, FIG. 1B is an enlarged cross-sectional view of a light emitting pixel PX in FIG. 1A, and FIG. 1C is an enlarged cross-sectional view of a leak portion LK in FIG. 1A.

In FIG. 1A to FIG. 1C, with respect to the organic electroluminescent display device, on a main substrate SUB1 which is preferably made of a light transmitting glass plate, a first electrode (here, anode) AD formed of a light transmitting metal thin film which is driven by a thin film transistor is formed. A bank BNK which defines the pixel from the neighboring pixel is formed in a peripheral portion of the anode AD, and a peeling suppression layer EC is formed in a state that the peeling suppression layer EC covers the anode AD which is surrounded by the bank BNK. Further, an organic light emitting layer OLE is formed on the peeling suppression layer EC in a stacked manner. On the peeling suppression layer EC, an organic light emitting layer OLE is formed in a stacked manner, and on the organic light emitting layer OLE, a second electrode (here, cathode) CD which is made of a conductive metal or the like is formed. Further, although not shown in the drawing, in the nitrogen atmosphere, a sealing glass substrate SUB2 which covers the second electrode on the main substrate SUB1 is adhered to the main substrate SUB1 using a sealing agent which surrounds a peripheral portion thus forming the sealing structure which has a sealing space in which nitrogen is filled.

Here, the anode AD is, for example, formed of a light transmitting conductive film made of ITO (In—Ti—O), IZO (In—Zn—O) or the like using a vapor deposition method, a sputtering method or the like. Although described later, the anode AD exhibits a high absorption ratio with respect to near ultraviolet rays having a laser wavelength of 315 nm to 380 nm and it is preferable to set a film thickness of the anode AD to 50 nm to 200 nm which exhibits a low absorption ratio with respect to the emitted light. Here, the relationship between the film thickness T of the anode AD and the laser wavelength λ is set such that $\{T \approx \alpha\lambda \times (1\pm 0.1)/4\}$ ($\alpha$ being an integer, $\pm 0.1$ being tolerance) is established.

Further, the peeling suppression layer EC is, to prevent the peeling of the anode AD from the main substrate SUB1 over the whole light emitting region when laser beams are radiated, formed of an organic conductive layer made of PEDOT, PSS or the like, for example, having the favorable hermetic adhesion property with the anode AD. A layer thickness of the peeling suppression layer EC is set to approximately 50 nm by an ink jet method or the like. Further, the organic light emitting layer OLE is constituted of a plurality of organic material layers. For example, the organic light emitting layer OLE is constituted of the stacked structure consisting of a hole injection layer, a hole transport layer, a light emitting layer, an electron transport layer in order from the anode AD side, wherein these layers are stacked by applying means such a vapor deposition method, an ink jet method or the like. Further, the cathode CD is formed of a conductive matted film made of Al, Cr or the like by a vapor deposition method, a sputtering method or the like.

Figure 9:
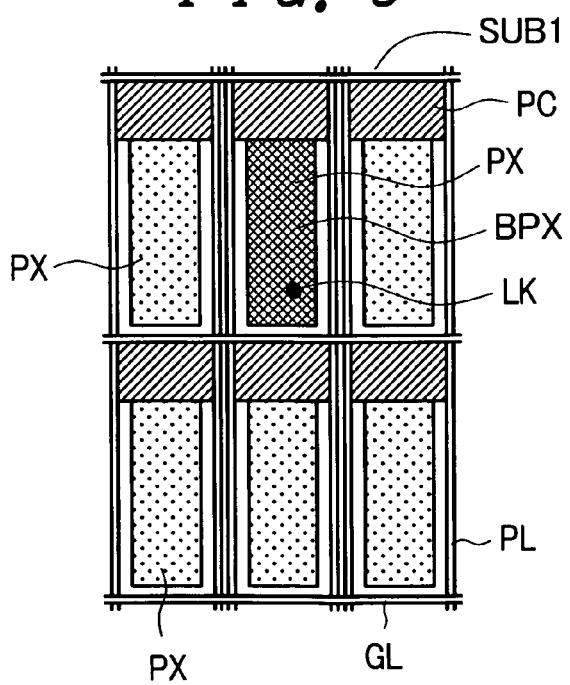
FIG. 9 is a plan view of an essential part of a display region of the organic electroluminescent display device.

With respect to the organic electroluminescent display device having such a constitution, in a step for forming a large number of pixels on the main substrate SUB1, as shown in FIG. 1C, due to a certain reason, in the organic light emitting layer OLE in the inside of the opening of the pixel, a leak portion LK is generated and such a pixel constitutes a black-dot failure defect pixel BPX as shown in FIG. 9.

In such a state, as shown in FIG. 1C, the leak portion LK is irradiated with laser beams LE from the outside of the main substrate SUB1. The laser beams LE used in such laser beam radiation may be laser beams which are absorbed by the main substrate SUB1 and the anode AD. For example, the leak portion LK is irradiated with the laser beams LE having a wavelength of approximately 355 nm, a single oscillation output of approximately 1 mJ and an irradiation diameter of approximately φ1 µm.

Figure 2:
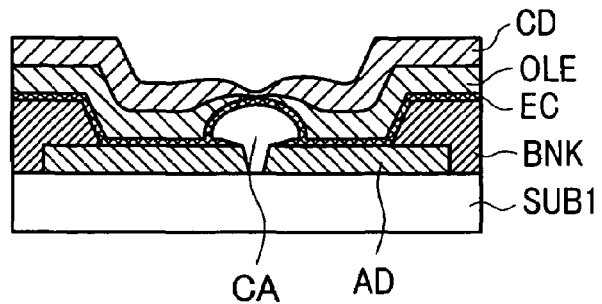

Due to this laser beam irradiation, in the periphery of the leak portion LK, the anode AD absorbs the laser beams LE and generates heat. Due to this heat, the anode AD is evaporated and hence, as shown in FIG. 2 which is an enlarged cross-sectional view, a cavity portion CA which is formed in peeled state is formed on an interface between the anode AD and the peeling suppression layer EC. Due to the formation of the cavity portion CA, the leak portion LK is electrically cut and separated and hence, a black-dot defective pixel BPX having the leak portion LK shown in FIG. 9 is repaired to form the light emitting pixel PX shown in FIG. 1A.

In this case, since the cavity portion CA which is generated by the repairing is covered with the cathode CD, the organic light emitting layer OLE is protected from the moisture and oxygen which deteriorate the organic light emitting layer OLE and the non-light-emitting region hardly spreads. Further, only a peripheral portion of the leak portion LK is irradiated with the laser beams LE as shown in FIG. 1A and FIG. 1C and hence, although the leak portion LK does not emit light as shown in FIG. 1A, the major portion can emit light so that the black-dot defective pixel BPX is repaired to form the light emitting pixel PX.

Embodiment 2

Figure 3A:
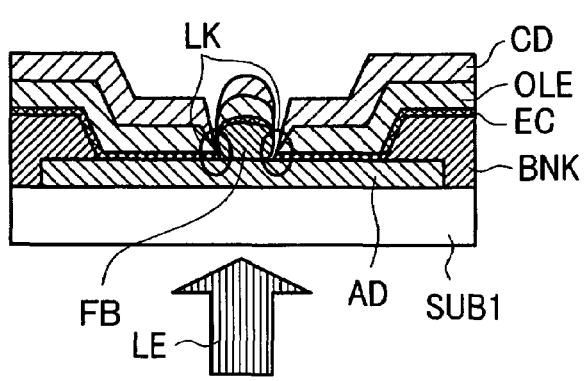
Figure 3B:
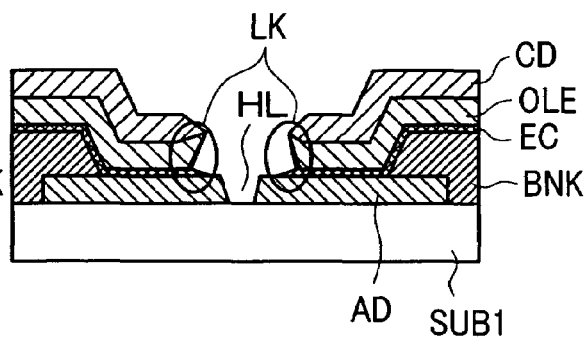

FIG. 3A and FIG. 3B are views showing an active-matrix-type organic electroluminescent display device which schematically shows the constitution of an embodiment 2 of the organic electroluminescent display device according to the present invention, wherein FIG. 3A is the enlarged cross-sectional view of the black-dot defective pixel and FIG. 3B is the enlarged cross-sectional view of a light emitting pixel after repairing the black-dot defective pixel. Parts identical with the parts shown in the above-mentioned drawings are given same symbols and their explanation is omitted.

With respect to the organic electroluminescent display device having such a constitution, in a step for forming a large number of pixels on a main substrate SUB1, due to the presence of a foreign material FB on an anode AD in the inside of an opening formed in a pixel shown in FIG. 3A, a stepped cut is formed in a peeling suppression layer EC, a cathode CD is formed on a thin film portion of a short-circuiting portion. Eventually, a distance between the anode AD and the cathode CD becomes small thus generating leak portions LK which constitute black-dot defective pixels.

In such a state, a region which covers the foreign material FB on the anode AD is irradiated with laser beams LE in the same manner as the embodiment 1. Due to such laser irradiation, the anode AD absorbs the laser beams LE in the periphery of the foreign material FB and generates heat and the anode AD is evaporated by the heat. Due to such evaporation of the anode AD, as shown in FIG. 3B, the peeling is generated on an interface between the anode AD and the peeling suppression layers EC and hence, an opening portion HL which is communicated with a surface of the main substrate SUB1 is formed. Accordingly, the leak portions LK shown in FIG. 3A are electrically cut and separated and hence, the black-dot defective pixel is repaired to form the light emitting element.

Embodiment 3

Figure 4A:
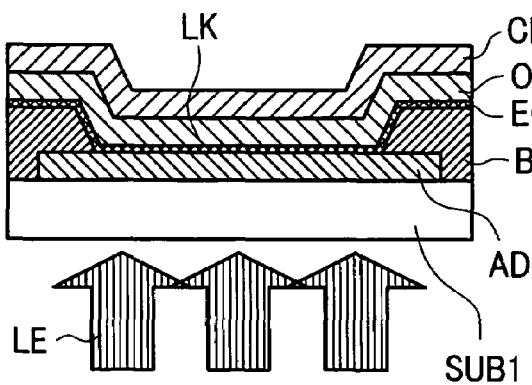
Figure 4B:
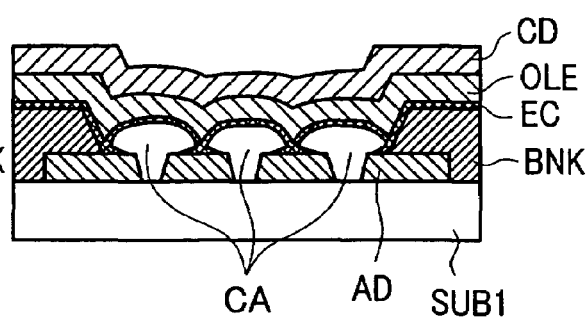

FIG. 4A and FIG. 4B are views showing an active-matrix-type organic electroluminescent display device which schematically shows the constitution of an embodiment 3 of the organic electroluminescent display device according to the present invention wherein FIG. 4A is the enlarged cross-sectional view of the black-dot defective pixel and FIG. 4B is the enlarged cross-sectional view of a light emitting pixel after repairing the black-dot defective pixel. Parts identical with the parts shown in the above-mentioned drawings are given same symbols and their explanation is omitted.

With respect to the organic electroluminescent display device having such a constitution, in a step for forming a large number of pixels on a main substrate SUB1, due to an abnormality of a pixel circuit or the like, a larger amount of an electric current flows in a pixel shown in FIG. 4A than other pixels and hence, a brightness defect pixel is formed.

In such a state, a whole region or an arbitrary region of an opening portion of the brightness defect pixel is irradiated with laser beams LE in the same manner as the embodiment 1. In the region which is irradiated with laser beams by the laser irradiation, the anode AD absorbs the laser beams LE, generates heat and is evaporated. Due to such evaporation of the anode AD, as shown in FIG. 4B, the peeling is generated on an interface between the anode AD and the peeling suppression layers EC and hence, cavity portions CA which are communicated with a surface of the main substrate SUB1 are formed.

At portions where these cavity portions CA are formed, the leak portions are electrically separated and hence, an electric current does not flow and light is not emitted. Accordingly, a light emitting region is decreased and hence, the luminance of the whole pixel is reduced whereby it is possible to form the bright-failure defective pixel shown in FIG. 4A inconspicuous.

Embodiment 4

Figure 5A:
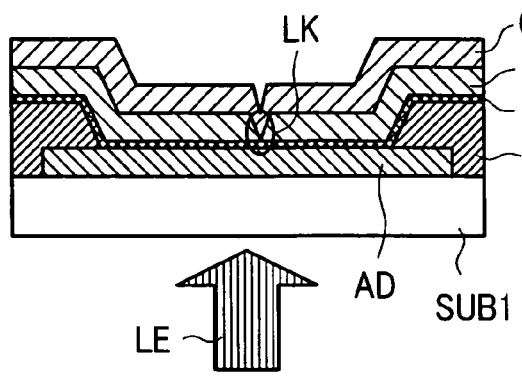
Figure 5B:
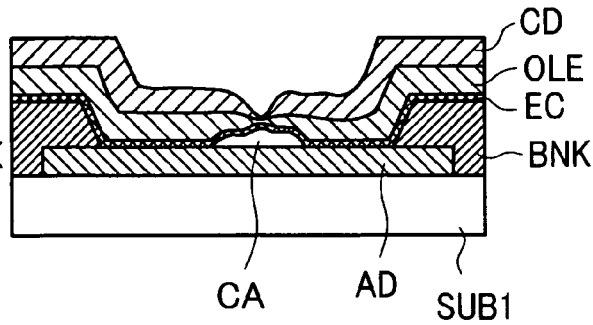

FIG. 5A and FIG. 5B are views of a pixel of an active-matrix-type organic electroluminescent display device which schematically shows the constitution of an embodiment 4 of the organic electroluminescent display device according to the present invention wherein FIG. 5A is the enlarged cross-sectional view of the black-dot defective pixel and FIG. 5B is the enlarged cross-sectional view of a light emitting pixel after repairing the black-dot defective pixel. Parts identical with the parts shown in the above-mentioned drawings are given same symbols and their explanation is omitted.

In the organic electroluminescent display device, an anode AD which is formed of a light transmitting metal film which is driven by a thin film transistor is formed on a main substrate SUB1 which is preferably formed of a light transmitting glass plate. Further, a bank BNK which defines the neighboring pixel in the peripheral portion of the AD and a heat expansion layer HE is formed in a state that the heat expansion layer HE covers the anode AD surrounded by the bank BNK.

Here, the heat expansion layer HE is formed of a material having a larger thermal expansion ratio than the anode AD such as polyvinyl carbazole, for example. The heat expansion layer HE is formed into a film having a thickness of approximately 30 nm. Further, an organic light emitting layer OLE is formed on the heat expansion layer HE in a stacked manner, and a cathode CD made of conductive metal or the like is formed on the organic light emitting layer OLE. That is, the constitution which makes this embodiment different from the constitution shown in FIG. 1 lies in the formation of the heat expansion layer HE in place of the peeling suppression layer EC shown in FIG. 1.

In the organic electroluminescent display device having such a constitution, with respect to the pixel shown in FIG. 5A, in a step for forming a large number of pixels on a main substrate SUB1, due to the generation of short-circuiting in the organic light emitting layer OLE in the inside of the opening formed in the pixel, a leak portion LK is generated and this leak portion LK constitutes a black-dot defective pixel.

In such a state, in the same manner as the embodiment 1, the leak portion LK in the inside of the opening formed in the pixel is irradiated with laser beams LE. The laser beams LE used in such laser beam radiation may be laser beams which have an output smaller than an output of the laser beams in the embodiment 1 to an extent that the anode AD is not evaporated by the irradiation of laser beams LE. For example, the leak portion LK is irradiated with the laser beams LE having a wavelength of approximately 355 nm, a single oscillation output of approximately 0.5 mJ and an irradiation diameter of approximately $\phi 1$ μm. The anode AD is heated by the irradiation of the laser beams LE.

In this laser beam irradiation, the anode AD and the thermal expansion layer HE differ in the thermal expansion ratio and hence, whereby a physical force in the direction to peel off the thermal expansion layer HE is generated. Accordingly, as shown in FIG. 5B, a peeling state is generated between the anode AD and the thermal expansion layer HE and hence, a cavity portion CA is formed. Due to the formation of the cavity portion CA, the leak portion LK shown in FIG. 5A is electrically cut and separated and hence, a black-dot defective pixel is repaired to form the light emitting pixel.

Embodiment 5

Figure 6:
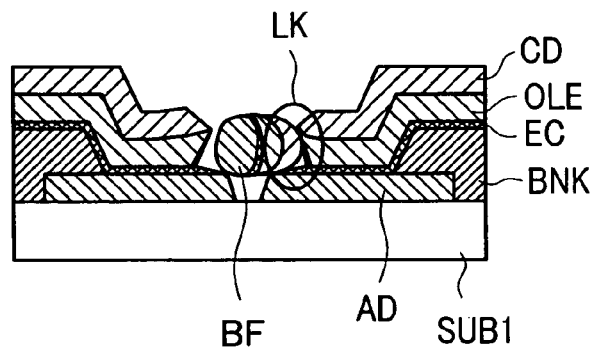
FIG. 6 is an enlarged cross-sectional view for explaining a repairing method of a black-dot defective pixel of an active-matrix-type organic electroluminescent display device which schematically shows the constitution according to an embodiment 5 of the organic electroluminescent display device of the present invention.

FIG. 6 is an enlarged cross-sectional view of a black-dot defective pixel of an active-matrix-type organic electroluminescent display device which schematically shows the constitution according to an embodiment 5 of the organic electroluminescent display device of the present invention. Parts identical with the parts shown in the above-mentioned drawings are given same symbols and their explanation is omitted. In a repairing method of the black-dot defective pixel according to the present invention, first of all, a cathode CD is formed on a main substrate SUB1 in a stacked manner and, thereafter, a lighting inspection of each pixel is performed in the inside of a vacuum vessel thus determining the black-dot defective pixel. Here, the operations are performed in a state that a cathode CD side of the main substrate SUB1 is directed downwardly.

In such a state, the black-dot defective pixel is irradiated with the laser beams from the main substrate SUB1 side in a vacuum state to perform the repairing. Here, the irradiation of laser beams is performed in a state that the cathode CD side of the main substrate SUB1 is directed downwardly. Since a foreign material FB which is generated at the time of performing the laser repairing is held in the vacuum state, the foreign material FB falls downwardly. According to such a method, as shown in FIG. 6, the foreign material FB which is generated due to the laser repairing returns to an original position and hence, it is possible to prevent the generation of the short-circuiting. Thereafter, a sealing glass substrate not shown in the drawing is adhered to the main substrate SUB1, and in the inside of a seal which surrounds a peripheral portion not shown in the drawing, nitrogen is filled and sealed thus forming a panel.

Embodiment 6

Figure 7:
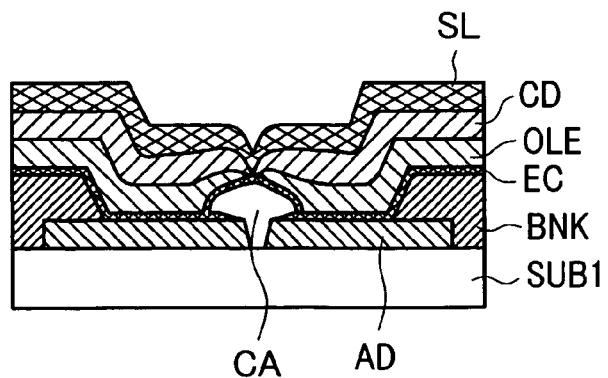
FIG. 7 is an enlarged cross-sectional view of a lighte emitting pixel after repairing a black-dot defective pixel of an active-matrix-type organic electroluminescent display device which schematically shows the constitution according to an embodiment 6 of the organic electroluminescent display device of the present invention.
Figure 8:
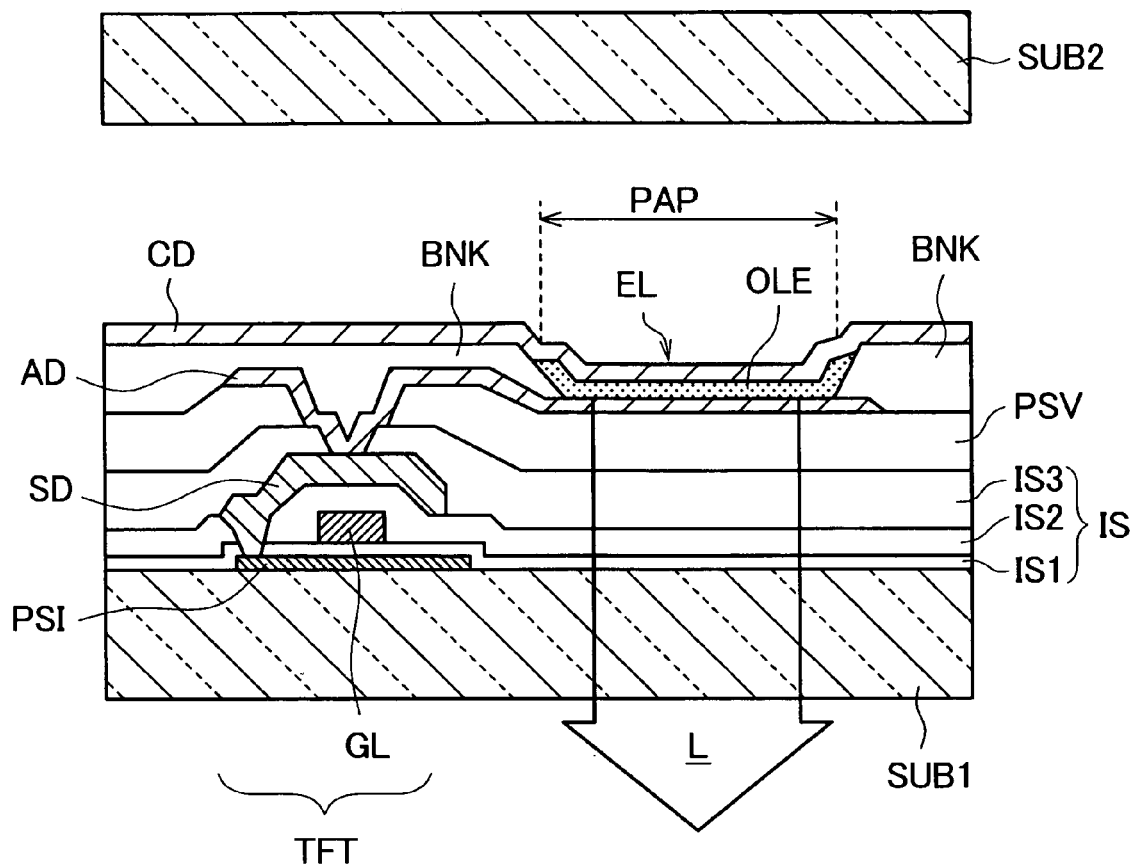
FIG. 8 is a cross-sectional view for schematically explaining a constitutional example of the vicinity of one pixel of the organic electroluminescent display device.

FIG. 7 is an enlarged cross-sectional view of a light emitting pixel after repairing a black-dot defective pixel of an active-matrix-type organic electroluminescent display device which schematically shows the constitution according to an embodiment 6 of the organic electroluminescent display device of the present invention, wherein parts identical with the parts shown in the above-mentioned drawings are given same symbols and their explanation is omitted. In FIG. 7, the constitution which makes this embodiment different from the embodiment shown in FIG. 2 lies in that a sealing film SL is formed on an upper surface of a cathode CD and hence, it is possible to surely isolate a space portion formed above the cathode CD and a cavity portion CA formed by peeling whereby an ability to protect an organic light emitting layer OLE from moisture, oxygen and the like which deteriorate the organic light emitting layer OLE is further enhanced thus further effectively suppressing the spreading of a non-light-emitting region which is generated due to the repairing. Here, the sealing frame SL may be formed of, for example, SiN or the like and a layer thickness of the sealing frame SL is set to approximately 300 nm by a CVD method or the like.

Here, with respect to the above-mentioned respective embodiments, in the embodiments 1 to 4, the explanation has been made with respect to the case in which the peeling suppression layer EC or the thermal expansion layer HE is provided between the anode AD and the organic light emitting layer OLE. However, it is possible to allow the organic light emitting layer OLE to possess the similar function. Further, in the embodiments 1 to 3, the explanation has been made with respect to the case in which the anode AD is evaporated. However, it may be possible to adopt the structure in which other layer such as the organic light emitting layer OLE, for example, is evaporated by the heat of the anode AD. Further, in the embodiment 4, the explanation has been made with respect to the case in which the peeling is generated between the anode AD and the thermal expansion layer HE. However, the peeling may be generated between any layers from the anode AD to the cathode CD.

Further, by using the repairing method of the defective pixel of the organic electroluminescent display device according to the present invention in combination with a system which specifies the leak portion in the inside of the black-dot defective pixel, a system which specifies the bright-dot portion in the inside of the bright-dot failure defective pixel, or a system which has both function, it is possible to perform the repairing of the black-dot defective pixel or the bright-failure defective pixel more speedily.

Here, in the above-mentioned respective embodiments, although the explanation has been made with respect to the bottom-emission-type organic electroluminescent display device, it is needless to say that the present invention is not limited to such an organic electroluminescent display device and it is possible to obtain the similar manner of operation and advantageous effects even when the present invention is applied to the top-emission-type organic electroluminescent display device.

Further, although the explanation has been made with respect to the organic electroluminescent display device which mounts the organic light emitting elements thereon in the above-mentioned embodiments, it is needless to say that the present invention is not limited to such an organic electroluminescent display device and the present invention is applicable to versatile display devices which mounts organic light emitting elements thereon including a TV set, a PC monitor, a notebook type PC, a PDA, a mobile phone, a digital still camera, a digital video camera, a monitor of a car navigation system and the like.

Further, when the above-mentioned cavity portion is analyzed toward the main substrate SUB1 side from the sealing substrate SUB2 side, a large amount of aluminum is detected and, thereafter, a large amount of single carbon which is generated by the carbonization of the organic film due to the laser irradiation is detected.

What is claimed is:

1. An organic electroluminescent display device which includes a plurality of organic light emitting elements which form pixels in the inside of a main surface of a light transmitting substrate which is hermetically sealed to an insulating substrate in a state that the light transmitting substrate faces the insulating substrate in an opposed manner with a sealing material interposed between peripheral portions of the substrates, and in which each organic light emitting element includes a first electrode which is formed on the main surface of the light transmitting substrate, organic light emitting layers which are formed in a state that the organic light emitting layers cover the first electrode and have a light emitting function, and a second electrode which is formed in common over the plurality of organic light emitting elements, wherein an emitted light from the organic light emitting layer is radiated to the light transmitting substrate side by way of the first electrode, wherein a peeling suppression layer is provided between the first electrode and the organic light emitting layer, and a cavity portion which is formed by evaporating the first electrode due to an absorption of laser beams of near ultraviolet rays is provided between the peeling suppression layer and the light transmitting substrate.

2. An organic electroluminescent display device according to claim 1, wherein a film thickness of the first electrode is set to a value which falls within a range of 50 to 200 nm.

3. An organic electroluminescent display device according to claim 1, wherein a sealing film is formed on an upper surface of the second electrode.

4. A method of repairing a defective pixel of an organic electroluminescent display device which includes a plurality of organic light emitting elements which form pixels in the inside of a main surface of a light transmitting substrate which is hermetically sealed to an insulating substrate in a state that the light transmitting substrate faces the insulating substrate in an opposed manner with a sealing material interposed between peripheral portions of the substrates, and in which each organic light emitting element includes a first electrode which is formed on the main surface of the light transmitting substrate, organic light emitting layers which are formed in a state that the organic light emitting layers cover the first electrode and have a light emitting function, and a second electrode which is formed in common over the plurality of organic light emitting elements, wherein an emitted light from the organic light emitting layer is radiated to the light transmitting substrate side by way of the first electrode, wherein a peeling suppression layer is formed between the first electrode and the organic light emitting layer, and the first electrode is irradiated with laser beams of near ultraviolet rays thus evaporating a portion of the first electrode which is irradiated with the laser beams of near ultraviolet rays.

5. A method of repairing a defective pixel of an organic electroluminescent display device according to claim 4, wherein a wavelength band of the near ultraviolet rays is set to a range of 315 nm to 380 nm.

* * * * *